United States Patent
Toy et al.

[11] Patent Number: 5,982,038
[45] Date of Patent: Nov. 9, 1999

[54] CAST METAL SEAL FOR SEMICONDUCTOR SUBSTRATES

[75] Inventors: Hilton T. Toy, Wappingers Falls; Lannie R. Bolde, New Paltz; James H. Covell, II; David L. Edwards, both of Poughkeepsie; Lewis S. Goldmann, Bedford; Peter A. Gruber, Mohegan Lake, all of N.Y.

[73] Assignee: International Business Machines Corporation, Armonk, N.Y.

[21] Appl. No.: 08/850,092

[22] Filed: May 1, 1997

[51] Int. Cl.[6] .......................... H01L 23/48; H01L 23/52; H01L 29/40
[52] U.S. Cl. ............................................ 257/772; 257/779
[58] Field of Search .................................. 257/772, 704, 257/706, 710, 737, 779

[56] References Cited

U.S. PATENT DOCUMENTS

| | | | |
|---|---|---|---|
| 2,623,273 | 12/1952 | Murray et al. | 257/772 |
| 4,020,987 | 5/1977 | Hascoe | 228/56 |
| 4,322,737 | 3/1982 | Sliwa, Jr. | 357/82 |
| 4,486,511 | 12/1984 | Chen et al. | 257/772 |
| 4,500,945 | 2/1985 | Lipschutz | 361/386 |
| 4,504,849 | 3/1985 | Davies et al. | 257/772 |
| 4,673,772 | 6/1987 | Satoh et al. | 257/779 |
| 4,746,583 | 5/1988 | Falanga | 428/632 |
| 5,151,773 | 9/1992 | Matsui et al. | 257/704 |
| 5,153,709 | 10/1992 | Fukuoka | 357/71 |
| 5,244,143 | 9/1993 | Ference et al. | 228/180.21 |
| 5,248,250 | 9/1993 | Adachi | 425/547 |
| 5,275,549 | 1/1994 | Yamasaki | 425/546 |
| 5,276,289 | 1/1994 | Satoh et al. | 257/779 |
| 5,311,402 | 5/1994 | Kobayashi et al. | 257/779 |
| 5,329,160 | 7/1994 | Miura et al. | 257/710 |
| 5,380,184 | 1/1995 | Von Holdt, Sr. | 425/547 |
| 5,395,226 | 3/1995 | Sakai et al. | 425/116 |
| 5,414,300 | 5/1995 | Tozawa et al. | 257/704 |
| 5,471,027 | 11/1995 | Call et al. | 219/85.13 |
| 5,523,260 | 6/1996 | Missele | 437/209 |
| 5,744,752 | 4/1998 | McHerron et al. | 257/704 |

FOREIGN PATENT DOCUMENTS

| | | | |
|---|---|---|---|
| 62-88345 | 4/1987 | Japan | 257/710 |
| 63-313841 | 12/1988 | Japan | 257/710 |

*Primary Examiner*—Olik Chaudhuri
*Assistant Examiner*—Phat X. Cao
*Attorney, Agent, or Firm*—Aziz M. Ahsan

[57] ABSTRACT

The present invention relates generally to a new scheme of providing a seal for semi-conductor substrates and chip carriers. More particularly, the invention encompasses a structure and a method that uses a multi-layer metallic seal to provide protection to chips on a chip carrier. This multi-layer metal seal provides both enhanced hermeticity lifetime and environmental protection.

For the preferred embodiment the multi-layer metallic seal is a two layer, solder structure which is used to create a low cost, high reliability, hermetic seal for the module. This solder structure has a thick high melting point temperature region that is attached to a cap, and a thin interconnecting region of lower melting point temperature region for sealing the substrate to the cap.

17 Claims, 2 Drawing Sheets

CAST METAL SEAL FOR SEMICONDUCTOR SUBSTRATES

CROSS-REFERENCE TO RELATED PATENT APPLICATION

This Patent Application is related to U.S. Pat. No. 5,821,161 entitled "CAST METAL SEAL FOR SEMICONDUCTOR SUBSTRATES AND PROCESS THEREOF", assigned to the assignee of the instant Patent Application, and the disclosure of which is incorporated herein by reference.

FIELD OF THE INVENTION

The present invention relates generally to a new scheme of providing a seal for semiconductor substrates and chip carriers. More particularly, the invention encompasses a structure and a method that uses a multi-layer metallic seal to provide protection to chips on a chip carrier. This multi-layer metal seal provides both chip fatigue life enhancement and environmental protection.

For the preferred embodiment the multi-layer metallic seal is a two layer, solder structure which is used to create a low cost, high reliability, hermetic seal for the module. This solder structure has a thick cast high melting point temperature region that is attached to a cap, and a thin interconnecting region of lower melting point temperature region for sealing the substrate to the cap.

BACKGROUND OF THE INVENTION

Semiconductor devices are becoming smaller and more dense with the evolution of new technology. However, increases in chip circuit density produce a corresponding emphasis on overall chip packaging strategies in order to remain competitive. Chip and chip carrier manufacturers are therefore constantly being challenged to improve the quality of their products by identifying and eliminating problems, reducing package size and weight, decreasing package costs, providing improved thermal efficiencies and better and more advanced chips. Whereas significant improvements are being made to eliminate systematic problems by reducing process variability, process improvements alone are not sufficient to eliminate all the problems which effect both performance and reliability.

One way to provide a high level of environmental protection for a package is to have a hermetic seal. Of course, preserving module reworkability is a cost advantage, especially for multi-chip modules (MCMs).

One method to obtain a hermetic seal is by using a solder seal. For traditional solder seal packages to be reliable, it is necessary for modules to use expansion matched components, that is, that when the module is powered on, the expansion of the cap at the seal closely matches the expansion of the substrate at the seal. In early solder seal packages, chip powers were low, and the module was fairly isothermal, so expansions were matched by matching the cap's thermal coefficient of expansion (TCE) to the substrate's TCE. This was often done using the same material for both substrate and cap or cover. In this manner, ceramic substrates were often sealed to ceramic caps. The seal was very reliable, but the cap was very expensive.

In some applications, the thermal conductivity of ceramic caps is not sufficient, but most materials that have sufficiently high thermal conductivity also have TCE's that are too high for seal reliability requirements.

As module powers have risen, modules are no longer isothermal, and in some applications, the substrate temperatures during use are significantly higher than the cap temperatures. In order for these modules to have matched amounts of expansion at the solder seal, the components have to have different TCE's. The optimum TCE of the cap is a function of the substrate TCE and the module thermal gradients during use. TCE selection is application specific, and this contributes to a high cap cost.

U.S. Pat. No. 4,020,987 (Hascoe) discloses an alloy core having upper and lower thin alloy coatings, which is punched to form a punched solder performing for use in hermetically sealing a container. During reflow all of the solder layers melt and mix together to form a homogeneous seal band.

U.S. Pat. No. 4,291,815 (Gordon, et al.) discloses a ceramic lid assembly which includes an integral heat fusible layer defining a hermetic sealing area provided around the periphery of the ceramic lid for hermetic sealing of semiconductor chips in a flat pack.

U.S. Pat. No. 4,746,583 (Falanga) discloses a ceramic combined cover, where a solder layer in the form of a pre-cut gold-tin solder frame is tack welded onto a gold layer. The gold layer is readily wettable by the solder layer and is also extremely corrosion resistant.

U.S. Pat. No. 5,153,709 (Fukuoka) teaches the joining of a cap to a ceramic substrate using a connection conductor pattern, an annular inorganic insulation layer, an annular metallized layer and eutectic solder.

U.S. Pat. No. 5,244,143 (Ference, et al.) assigned to the assignee of the instant patent application and the disclosure of which is incorporated herein by reference, describes an apparatus and method for injection molding solder mounds onto electronic devices.

U.S. Pat. No. 5,329,160 (Miura) discloses a low-melting brazing metal separated by a gap-creating spacer which is used in joining a cover to a ceramic substrate having sealing metallized portions.

U.S. Pat. No. 5,471,027 (Call, et al.), discloses a method for forming a chip carrier with a single protective encapsulant. He specifically teaches the use of a picture-frame type area, which is only on the top surface and away from the edges of the substrate, to seal the cap or cover or heat sink to the substrate using a cap sealant.

U.S. Pat. No. 5,718,361, (Braun, et al.), assigned to the assignee of the instant patent application and the disclosure of which is incorporated herein by reference, describes an apparatus and method for forming mold for metallic material, where the metallic interconnections in a mold can be used to form structures, such as, for example, solder connections, heat sinks with fins, etc.

U.S. Pat. No. 5,718,367, (Covell, et al.), assigned to the assignee of the instant patent application and the disclosure of which is incorporated herein by reference, describes a mold transfer apparatus and method, where the metallic connections made in the mold can also be used to form structures, such as, for example, heat sinks with fins, etc.

Therefore, one way to maintain hermetic seal reliability, decrease cost and improve package thermal performance, would be to develop a new solder seal that can accommodate greater mismatches in expansions between the cap and the substrate during use.

PURPOSES AND SUMMARY OF THE INVENTION

The invention is a novel scheme to provide a multi-layered metallic seal for semiconductor substrates and method thereof.

Therefore, one purpose of this invention is to provide a multi-layered metallic seal for hermetically sealing semiconductor substrates to caps having different amounts of thermal expansion at the seal.

Another purpose of this invention is to provide a multi-layered solder seal for semiconductor substrates.

Still another purpose of this invention is to have a multi-layered solder seal for semiconductor substrates, where at least one layer of the solder seal is thick having a high melting point temperature, and at least one layer of solder seal that is thin and has a lower melting point temperature.

Another purpose of this invention is to provide for a fluid-tight seal.

Still another purpose of this invention is to have a hermetic seal.

Therefore, in one aspect this invention comprises a seal band to provide a hermetic seal between a cover and a semiconductor substrate, said seal band comprising at least one high melting point thick solder wall secured to said cover and at least one first thin solder interconnection layer securing said substrate to said high melting point thick solder wall, wherein said first thin solder interconnection layer is made from a lower melting point solder material than said high melting point thick solder wall, and wherein upon reflow said first thin solder interconnection layer does not reflow into said high melting point thick solder wall, such that said solder seal band retains its layered structure.

In another aspect this invention comprises a process for forming a hermetic seal band between a cover and a semiconductor substrate, comprising the steps of:

(a) casting a high temperature solder material in a mold, (b) fluxing peripheral edges of said cover with a fluxing material, (c) aligning said mold to said cover such that said cast high temperature solder material is in contact and aligned with said fluxed peripheral edges of said cover, and reflowing said high temperature solder material onto said cover and forming a high temperature thick solder wall on said cover, (d) forming at least one thin solder interconnection layer onto said semiconductor substrate, (e) placing said high temperature thick solder wall in contact with said thin solder interconnection layer, (f) placing said assembly in a thermal environment and reflowing said first thin solder interconnection layer such that a hermetic seal band is formed between said semiconductor substrate and said cover.

In yet another aspect this invention comprises a process for forming a hermetic seal band between a cover and a semiconductor substrate, comprising the steps of:

(a) casting a high temperature solder material in a mold, (b) fluxing peripheral edges of said cover with a fluxing material, (c) aligning said mold to said cover such that said cast high temperature solder material is in contact and aligned with said fluxed peripheral edges of said cover, and reflowing said high temperature solder material onto said cover and forming a high temperature thick solder wall on said cover, (d) forming at least one thin solder interconnection layer onto said high temperature thick solder wall, (e) placing said thin solder interconnection layer over a substrate, (f) placing said assembly in a thermal environment and reflowing said first thin solder interconnection layer such that a hermetic seal band is formed between said semiconductor substrate and said cover.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

When a semiconductor module is powered the heat generated by the semiconductor elements causes the substrate and cap to heat. The amount that each component heats up combined with that component's thermal coefficient of expansion determines how much the component expands. Any difference between the expansion of the substrate and the expansion of the cap causes a strain in the seal (that attaches the cap to the substrate). The strain in the seal is proportional to the difference in expansions, and inversely proportional to the thickness of that seal. The current invention is a novel seal structure that is stable, reliable, and much thicker than traditional solder seals, and is therefore able to accommodate many times as much mismatch between a cap and the substrate as traditional solder seals.

IBM's multilayered ceramic (MLC) electronic packages are among the most technically advanced electronic packages in the industry; however some of the high function modules require expensive components. This invention describes one way to reduce the cost of such packages without any loss or degradation of their performance. Packaging methods which reduce costs, advantageously increase the availability of such electronic packages in the marketplace. As a person skilled in the art knows, increased packaging density is typically achieved by greater utilization of the surface area or real estate of the substrate or module.

Figure 1:
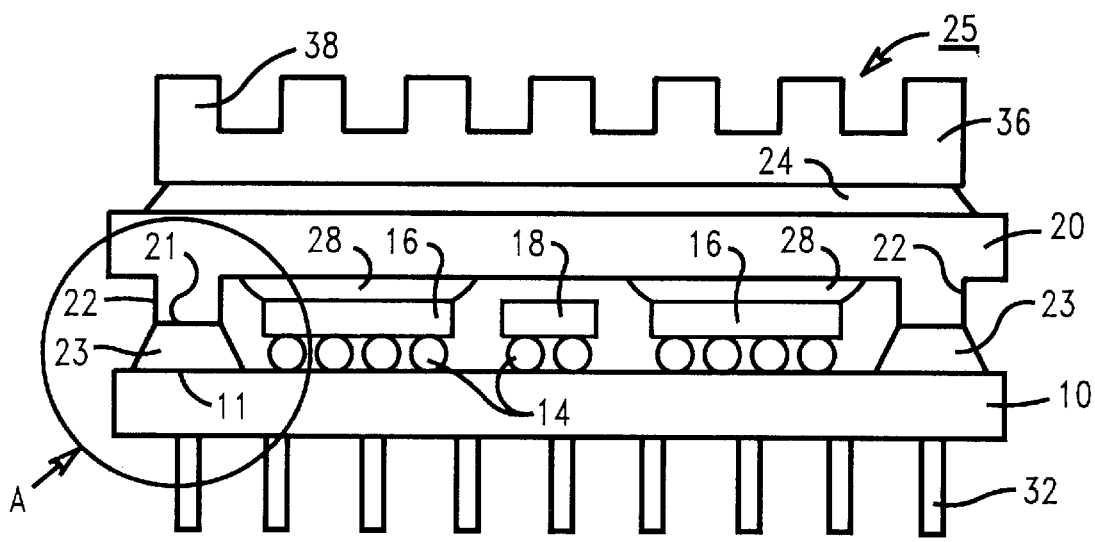
FIG. 1, illustrates a preferred embodiment of this invention.
Figure 2:
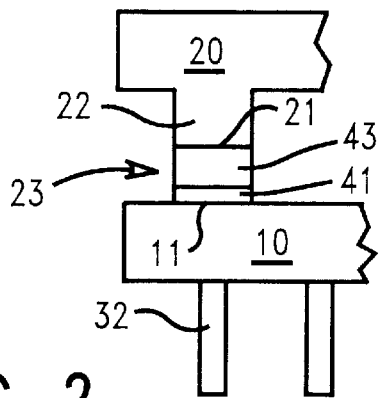
FIG. 2, illustrates an enlarged view of the corner "A" as shown in FIG. 1.

FIGS. 1 and 2, illustrate a preferred embodiment of an assembled module 25, of this invention. Typically, at least one chip 16, is first secured to a substrate or module 10, via a plurality of solder connections 14, such as, solder balls 14. The substrate 10, could also have one or more electrical device(s) 18, such as, for example, a decoupling capacitor 18, that is also electrically connected to the substrate 10, via a plurality of solder connections 14, such as, solder balls 14. An optional thermally conductive material 28, may be applied over the exposed surface of the chip 16, such that a direct thermal contact is made between the chip 16, and a cap or cover 20, when the cover 20, is placed over to cover and protect the electronic elements, such as, chip 16, decoupling capacitor 18, solder connections 14, to name a few. A cap sealant or solder seal 23, is then provided, in order to secure the cap or cover 20, to the substrate or module 10.

The material for the substrate 10, is typically selected from a group comprising alumina, alumina with glass frits, aluminum nitride, borosilicate, ceramic, glass ceramic, to name a few.

The material for the cap or cover 20, is typically selected from a group comprising alumina, aluminum, aluminum nitride, composites of aluminum and silicon carbide, copper, copper-tungsten, cuvar (invar impregnated with copper), silvar (invar impregnated with silver) and alloys thereof, to name a few.

Semiconductor elements, such as, chips 16, decoupling capacitors 18, to name a few, are typically electrically connected to the substrate 10, and wherein the electrical connection is normally selected from a group comprising of solder ball, solder column, low-melting point solder, high-melting point solder, pin, wire, to name a few.

The substrate 10, is typically secured to a board or card (not shown) via electrical I/O (Input/Output) means 32, such as, for example, pins 32.

At least one optional heat receiving device 36, such as, a heat sink or heat spreader 36, can be secured to the cap or cover 20, such as, by using an adhesive 24. However, other mechanical means, for example, clips (not shown), could be used to attach the heat sink 36, to the cap 20. The heat sink 36, could have heat fins 38.

As stated earlier, the optional thermal compound 28, may be placed between the chip 16, and the cap 20, to provide an efficient heat transfer path via the heat sink adhesive 24, to the at least one (optional) heat receiving device 36.

Figure 3:
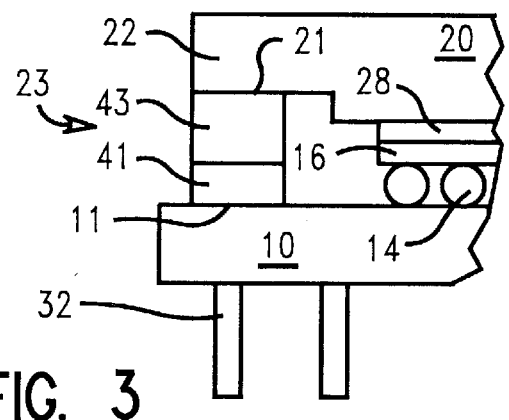
FIG. 3, illustrates an enlarged view of a corner of another preferred embodiment of this invention.

FIG. 3, illustrates an enlarged view of a corner of another preferred embodiment of this invention. As shown in FIG. 3, the cap or cover 20, has an extension 22, having surface area 21, to accommodate the cap solder seal 23.

Now referring back to FIGS. 1, 2 and 3, a picture-frame shaped area 11, is provided on the perimeter or peripheral edges of the surface of the substrate 10. A similar picture-frame type area 21, is also provided on the peripheral edges of the surface of the cap or cover 20. The inventive solder seal 23, is then used to secure the area 11, to area 21, such that the cap 20, provides a hermetic seal to the substrate 10.

For wettability to the solder, this perimeter area 21 and 11, on the cap 20, and substrate 10, respectively, has a solder wettable area, for example, a layer of gold over a layer of nickel. This frame shaped solder wettable surface 11 and 21, has a width that is typically between about 1.5 mm to about 2.5 mm wide.

Therefore the placement of all devices, such as, for example, chips 16, decoupling capacitors 18, etc., must be restricted to be within this picture frame area 11, which is typically less than 80 percent of the substrate 10, top surface area.

The cap or cover 20, is typically of a metal or a ceramic or a composite material and in most cases it is permanently secured to the upper or top surface of the substrate 10. This is done primarily to prevent mechanical and chemical injury to the electrical features on the substrate 10, such as, for example, chip 16, solder balls 14, decoupling capacitors 18, and any exposed metallurgy or circuitry on the substrate 10. It is well known that a leak in the cap 20, or in the cap solder seal 23, or any misalignment of the cap 20, could result in module yield losses. These losses could be substantial for an expensive module 10.

FIGS. 1, 2 and 3, clearly illustrate the preferred embodiments of this invention. Traditional solder seals have typically resulted in a separation of about 0.1 mm between the cap 20, and the substrate 10. With this invention, the new solder seal 23, results in a greater separation between the cap 20, and the substrate 10, which separation is between about 0.3 mm to about 2.0 mm, and typically about 1.0 mm.

In the new solder seal 23, a thick solder wall 43, is preferably cast onto the cap 20, and is connected to the substrate 10, by a thin interconnecting layer 41. The thick cast solder wall 43, has a different chemical composition than the interconnection layer 41, such that, the melting point of the solder wall 43, is higher than the melting point of the thin interconnection layer 41. In this manner, the interconnecting layer 41, may be reflowed for attachment of the cap 20, to the substrate 10, without melting or distorting the thick wall 43.

Figure 4:
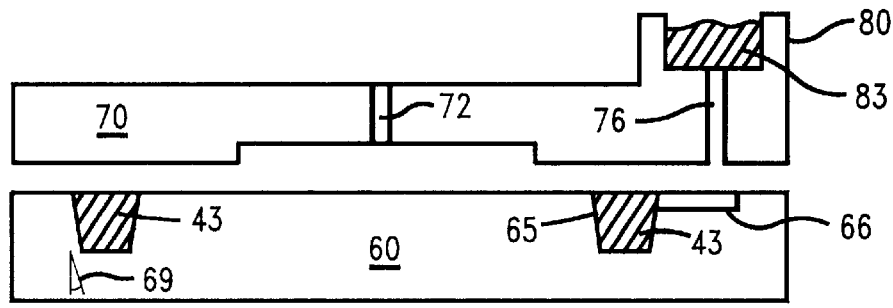
FIG. 4, illustrates the casting of high temperature solder in a mold according to a preferred embodiment of this invention.

In the preferred embodiment of this invention, the thick solder wall 43, is first cast into a mold 60, as more clearly seen in FIG. 4, and then attached to the cap 20. The integrity of the cap-solder assembly 20/43, can then be verified before the assembly 20/43, is sealed to the substrate 10. In this manner, the thick seal wall 43, can be attached to the cap 20, by reflowing the solder 43, while it is still in the mold 60, to maintain it's dimensional integrity.

The cap 20, could also have the layer 41, secured to the layer 43, which could then be attached to the solder wettable area 11, on the substrate 10, by reflowing the solder layer 41, without reflowing the thick wall 43.

This procedure is expected to have higher manufacturing yields because the solder to cap joint can be established and verified prior to attachment to the substrate 10. This also facilitates module rework, because if only the solder interconnection layer 41, is reflowed during cap removal, the thick solder wall 43, will remain attached to the cap 20. This reduces the amount of effort needed to dress the seal band on the substrate 10, prior to re-capping.

The inventive solder seal structure 23, requires a temperature hierarchy where the solder seal 23, comprises of the thick wall layer 43, that has a melting point that is higher than the melting point of the interconnecting layer 41. In order for this structure to be feasible to build in volume, there must also be a sufficient margin between these melting points, such that the solid wall 43, does not melt or significantly soften during interconnection to the substrate 10. With commonly used joining equipment, a margin of 50° C. or greater in melting points between the thick solder wall 43, and the solder layer 41, has been found adequate. Conceivably, advances in furnace or oven technology could reduce this margin. Thus, in the preferred embodiment, the thick wall solder layer 43, is selected from a range of materials such that the melting point is at least 50° C. higher than the melting point of the solder interconnection layer 41.

For example, the thick wall solder layer 43, may be selected from Lead/Tin, Lead/Indium, High Tin/Bismuth or low Tin/Bismuth or similar other solder materials.

For the Lead/Tin solder material 43, it is preferred that Lead is in the range of about 60 to about 100 percent by weight, with the balance being Tin and any other impurities.

For the Lead/Indium solder material 43, it is preferred that Lead is in the range of about 70 to about 100 percent by weight, with the balance being Indium and any other impurities.

For the High Tin/Bismuth solder material 43, it is preferred that Tin is in the range of about 77 to about 100 percent by weight, with the balance being Bismuth and any other impurities.

For the Low Tin/Bismuth solder material 43, it is preferred that Tin is in the range of about 0 to about 20 percent by weight, with the balance being Bismuth and any other impurities.

The thinner solder interconnection layer 41, may be selected from Lead/Tin, Lead/Indium or Tin/Bismuth or similar other solder materials.

For the Lead/Tin solder material 41, it is preferred that Lead is in the range of about 0 to about 40 percent by weight, with the balance being Tin and any other impurities.

For the Lead/Indium solder material 41, it is preferred that Lead is in the range of about 30 to about 60 percent by weight, with the balance being Indium and any other impurities.

For the Tin/Bismuth solder material 41, it is preferred that Tin is in the range of about 37 to about 48 percent by weight, with the balance being Bismuth and any other impurities.

Using the above solder material ratios by weight, a module designer will appreciate that the interconnecting layer 41, and the cast solder layer or wall 43, can be produced from different ratios of the same elements (as PbSn), or that the interconnecting layer and the wall can be produced from using different, yet compatible materials, such as PbIn interconnecting layers with a PbSn wall, or SnBi interconnecting layers with a PbSn wall.

However, it should be clear to one skilled in the art that solders from other systems could also be used for either the solder layer 43, or the solder layer 41, to provide the necessary temperature hierarchy and inter-layer compatibility. These solders may include, but not limited to, indium/silver, tin/antimony, tin/silver, or alloys thereof, to name a few.

Some of the solder materials listed above could also have as much as 2 percent copper as well, or trace quantities of other elements.

It is obvious to a skilled metallurgist that the selection of some materials for use as the wall 43, will reduce the potential list of interconnecting layer 41, in order to maintain the 50° C. difference in melting temperatures, as well as to use compatible materials.

The thickness of the solder wall 43, can be used to fix the thickness of the final solder joint, or the joint thickness can be larger, by using a standoff of greater height, and having the thickness of the interconnecting layers make up the difference.

Another way to achieve the desired solder gap is to make the design gap thickness equal to the sum of:

(a) the thickness of the wall solder 43, and
(b) the thickness of standoffs contained in the solder interconnecting layer 41.

In this manner, the preferred solder joint thickness of about 1.0 mm may be achieved with a thickness of about 0.9 mm for the thick wall solder 43, and then with a standoff of about 0.1 mm, for the layer 41.

Figure 8:
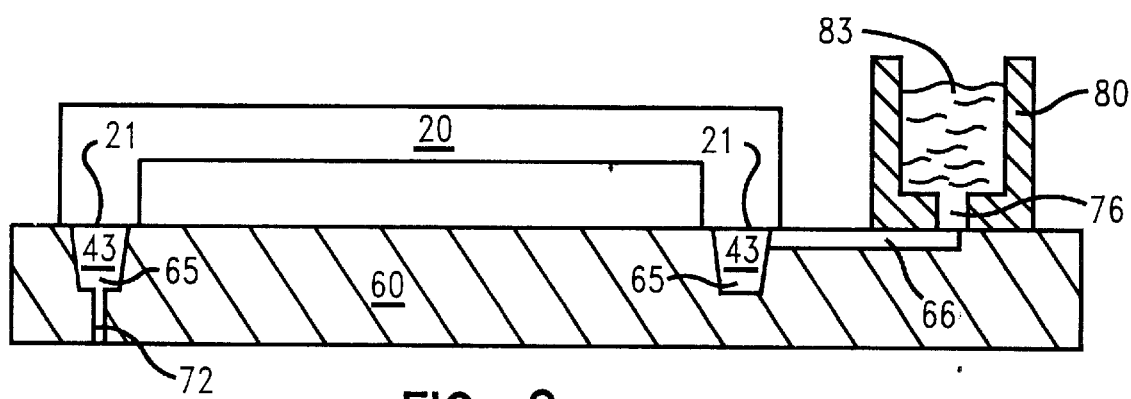
FIG. 8, illustrates another embodiment of this invention where at least one layer of high temperature solder is directly secured onto a cover.
Figure 5:
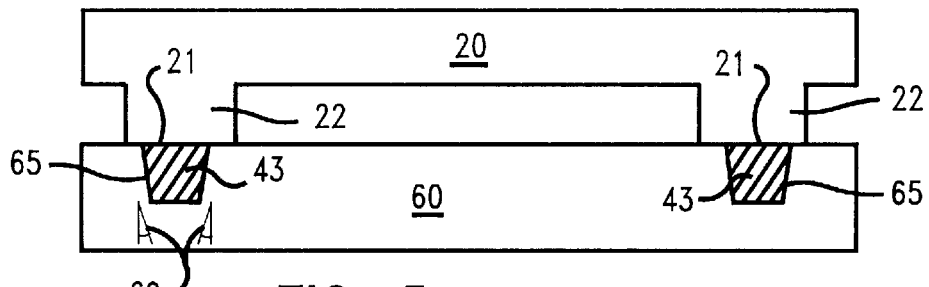
FIG. 5, illustrates the securing of the casted high temperature solder in a mold to a cover.
Figure 6:
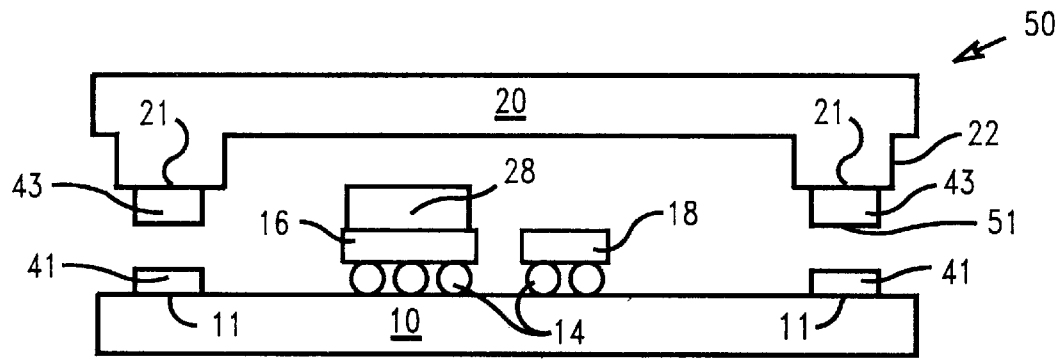
FIG. 6, illustrates the positioning of the casted high temperature solder on a cover and of a low temperature solder on a substrate in preparation for assembly.
Figure 7:
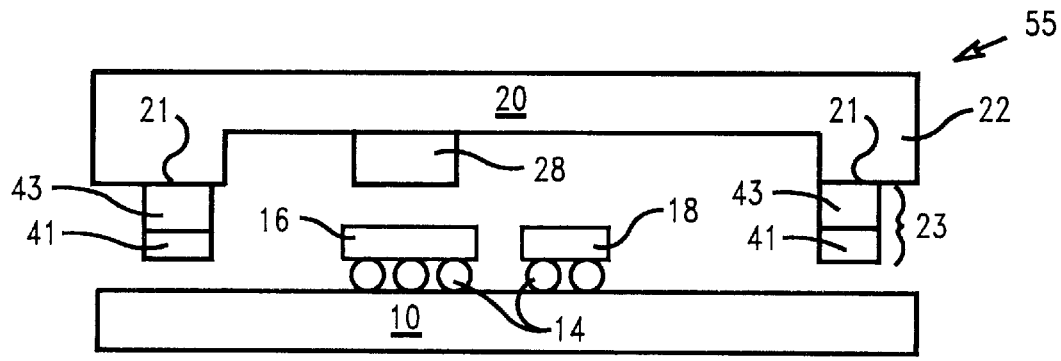
FIG. 7, illustrates another embodiment of this invention where a low temperature solder is secured to a high temperature solder prior to the joining of the cover to the substrate.

The preferred embodiment illustrated in FIG. 1, can be made in a number of ways. FIGS. 4, 5 and 6, illustrate a preferred method of casting the high temperature solder 43. While, FIGS. 7 and 8, illustrate other embodiments of the process of this invention.

FIG. 4, illustrates one method of casting of the high temperature solder 43, into a mold or boat 60. The mold 60, typically has blind holes or blind cavities 65, to accommodate the high temperature solder 43, and at least one filler groove 66, for filling the blind hole 65, with the high temperature solder 43. Care should be taken that the walls of the blind holes 65, have a taper 69, so that after casting, the high temperature solder 43, can be easily extracted from the mold 60. It has been found that a taper of at least 1 degree is required to make sure that the casted high temperature solder 43, will slide out of the blind hole 65. However, a taper 69, with a different taper angle 69, could also be used. Graphite is typically used to make the mold 60; however, other materials well known in the art can be used to make the mold 60.

A cover plate or mold head 70, having at least one vacuum port 72, and at least one solder port 76, is directly placed on the mold 60. A solder reservoir 80, having the high temperature solder 83, is connected to the mold head 70, via the solder port 76. Care should be taken that at least a portion of the solder port 76, and filler groove 66, are in direct contact, so that the high temperature solder 83, can be poured from the reservoir 80, into the blind hole 65, to form high temperature solder 43. The mold 60, and the mold head 70, are placed in a thermal environment, and a vacuum is drawn through the port 72. The molten solder 83, is injected from the reservoir 80, through the solder fill port 76, and travels along the filler groove 66, and fills the blind hole 65, forming the high temperature solder 43. The mold 60, and the mold head 70, are then allowed to cool to room temperature and the cover plate 70, is removed, leaving behind the cast high temperature solder 43, in the blind hole 65.

The next step after solder 43, has been casted is shown in FIG. 5, where the casted high temperature solder 43, in the mold 60, is secured to area 21, of the cover 20. This is typically done by fluxing area 21, with a suitable flux and then upon heating, the high temperature solder 43, reflows and attaches to area 21, of the cover 20.

After the high temperature solder 43, has been secured to the cover 20, the cover 20, along with the solder 43, is pulled away from the mold 60, forming an sub-assembly 50, as more clearly seen in FIG. 6. The sub-assembly 50, comprising of the secured casted high temperature solder 43, on the cover 20, is then secured to the low temperature solder 41, on a substrate 10. This securing of the cover 20, to the substrate 10, is typically done without flux, by mating the exposed surface of the high temperature solder 43, and/or low temperature solder 41, in a fixture (not shown) under light pressure, and then heating the area so that the cover 20, and substrate 10, are secured to each other to form module 25.

FIG. 7, illustrates another embodiment of this invention where the low temperature solder 41, is secured to the high temperature solder 43, on the cover 20, rather than on the substrate 10. This can be done by taking the sub-assembly 50, and fluxing the exposed area of high temperature solder 43, with a suitable flux and securing the low temperature solder 41, to it, and thereby forming a sub-assembly 55. This sub-assembly 55, is then joined to the substrate 10, to form the module 25.

U.S. Pat. No. 5,244,143 (Ference, et al.) assigned to the assignee of the instant patent application and the disclosure of which is incorporated herein by reference, describes an apparatus and method for injection molding solder mounds onto electronic devices. This patent also discloses materials which may be used for the mold, such as, mold 60, the temperature at which the deposition can take place, the desirable taper angle to enable mold removal after solder solidification, etc.

In one preferred embodiment, as shown in FIG. 4, a portion of the solder seal wall 23, consists of a thick layer of high melt solder 43, which is cast into a mold 60, typically made of graphite, to fully fill the mold cavity or blind hole 65. After the high melt solder 43, and the mold 60, have cooled, the peripheral edges 21, of the cap 20, are minimally fluxed with a suitable fluxing material, aligned and mated to the solder 43, in mold 60, such that the perimeter wettable area 21, is in contact with the solder 43, as more clearly seen in FIG. 5. The aligned parts are then introduced to a thermal environment, preferably, in a oxygen deficient or inert or reducing environment, such that the high melt solder layer 43, is again completely melted, and this reflow process attaches the solder layer 43, to the cap 20, at the wettable peripheral area 21. Use of flux is optional, but it is normally beneficial. Flux selection and application must be done carefully so that any gas that is generated during reflow does not introduce defects in the bulk solder 43, or at the attachment interface 21. After cooling, the cap 20/solder wall 43, forming a sub-assembly 50, is extracted from the mold 60. This sub-assembly 50, is then cleaned to remove any flux or other residue, and inspected, such as, for mechanical integrity. The exposed seal surface 51, of the high melt solder 43, is then pretinned with a thin coating of a low melt solder, such as, solder 41. A separate thin preform of low melt solder 41, is formed by methods well known in the art, and this preform 41, is attached to the substrate 10, by (a) applying a thin layer of flux to the perimeter solder wettable area 11, (b) placing the solder preform 41, on the solder wettable layer 11, (c) reflowing the low melt solder preform 41, (d) cleaning away any flux or other residue, and (e) inspecting for any defects, such as, wetting defects. Layer 41, may also be directly deposited by any of the several tinning methods well known in the industry. The substrate 10, with the low melt solder layer 41, forming a sub-assembly, is then joined to the high melt solder layer 43, of the sub-assembly 50, without flux, by aligning both sub-assemblies in a fixture and then reflowing layer 41, without reflowing or softening layer 43. This completed assembly 25, can then be checked as required. After passing testing, such as, leak testing, an optional heat sink 36, may be attached to exposed back surface of the cap 20.

In another embodiment, as shown in FIG. 4, a portion of the solder seal wall 23, consists of a thick layer of high melt solder 43, which is cast into a mold 60, typically made of graphite, to fully fill the blind hole 65. After the high melt solder 43, and the mold 60, have cooled, the peripheral edges 21, of the cap 20, are minimally fluxed with a suitable fluxing material, aligned and mated to the solder 43, in mold 60, such that the perimeter wettable area 21, is in contact with the solder 43, as more clearly seen in FIG. 5. The aligned parts are then introduced to a thermal environment, preferably, in a oxygen deficient or inert or reducing environment, such that the high melt solder layer 43, is again completely melted, and this reflow process attaches the solder layer 43, to the cap 20, at the wettable peripheral area 21. After cooling, the cap 20/solder wall 43, forming a sub-assembly 50, is extracted from the mold 60. This sub-assembly 50, is then cleaned to remove any flux residue, and inspected for mechanical integrity. The exposed seal surface 51, of the high melt solder 43, is then pretinned with a thin coating of a low melt solder, such as, solder 41, to form a sub-assembly 55, as more clearly seen in FIG. 7. The substrate 10, is then joined to the cap 20, without flux, by aligning them in a fixture, such that, the low melt solder 41 is in contact with the solder wettable area 11, on the substrate 10, and then reflowing layer 41, without reflowing or softening layer 43. This completed assembly 25, is then checked as required. After passing testing, such as, leak testing, an optional heat sink 36, may be attached to exposed back surface of the cap 20.

In yet another embodiment, as shown in FIG. 4, a portion of the solder seal wall 23, consists of a thick layer of high melt solder 43, which is cast into a mold 60, typically made of graphite, to fully fill the blind hole 65. After the high melt solder 43, and the mold 60, have cooled, the peripheral edges 21, of the cap 20, are minimally fluxed with a suitable fluxing material, aligned and mated to the solder 43, in mold 60, such that the perimeter wettable area 21, is in contact with the solder 43, as more clearly seen in FIG. 5. The aligned parts are then introduced to a thermal environment, preferably, in a oxygen deficient or inert or reducing environment, such that the high melt solder layer 43, is again completely melted, and this reflow process attaches the solder layer 43, to the cap 20, at the wettable peripheral area 21. After cooling, the cap 20/solder wall 43, forming the sub-assembly 50, is extracted from mold 60. This sub-assembly 50, can then be cleaned, such as, to remove any flux residue, and inspected, such as, for mechanical integrity. A separate thin preform of low melt solder 41, is formed by methods well known in the art, and this thin solder preform 41, is attached to the substrate 10, by (a) applying a thin layer of flux to the perimeter solder wettable area 11, (b) placing the low melt solder preform 41, on the solder wettable layer 11, (c) reflowing the low melt solder preform 41, (d) cleaning away any flux residue, and (e) inspecting for any wetting defects. Layer 41, may also be directly deposited by any of the several tinning methods well known in the art. The substrate 10/thin layer of low melt solder 41, forming a sub-assembly, is then joined to the high melt solder layer 43, of the sub-assembly 50, without flux, by aligning both sub-assemblies in a fixture, such that, the low melt solder 41, is in contact with the high melt solder layer 43, and then reflowing layer 41, without reflowing or softening layer 43. This completed assembly 25, can then be checked as required. After passing testing, such as, leak testing, an optional heat sink 36, may be attached to exposed back surface of the cap 20.

FIG. 8, illustrates another embodiment of this invention where at least one layer of high temperature solder 43, is directly secured onto the cover 20. In this embodiment, as shown in FIG. 8, the thick layer of high melt solder 43, is cast directly onto the solder wettable area 21, of the cap 20. A solder reservoir 80, having the high temperature solder 83, is connected to the mold 60, via the solder port 76. Care should be taken that at least a portion of the solder port 76, and filler groove 66, are in direct contact, so that the high temperature solder 83, can flow from the reservoir 80, into the blind hole 65, to form high temperature solder 43. The mold 60, is first placed against the cap 20, and aligned, such that the mold cavity 65, is aligned with the solder wettable area 21, which has preferably been lightly fluxed. The assembly comprising of the cap 20, and mold 60, is then placed in a thermal environment. Molten solder 83, is injected from the reservoir 80, via the solder port 76, into the filler groove 66, and enters the "blind" hole 65. At least one vacuum port 72, may optionally be used to draw vacuum through the port 72, to help facilitate the filling of the "blind" cavity 65. After cooling of the cap 20, and mold 60, the cap 20/high melt solder layer 43, forming a sub-assembly 50, is extracted from the mold 60, as more clearly seen in FIG. 6. This sub-assembly 50, can then be cleaned to remove any flux or other residue, and inspected, such as, for mechanical integrity. A separate thin preform of low melt solder 41, is formed by methods well known in the art, and this thin solder preform 41, is attached to the substrate 10, by (a) applying a thin layer of flux to the perimeter solder wettable area 11, (b) placing the solder preform 41, on the solder wettable layer 11, (c) reflowing the low melt solder preform 41, (d) cleaning away any flux or other residue, and (e) inspecting for any defects, such as, wetting defects. Solder preform layer 41, can also be put on the solder layer 43, or on both surfaces. The substrate 10, with the thin layer of low melt solder 41, forming a sub-assembly, is then joined to the high melt solder layer 43, of the sub-assembly 50, without flux, by aligning both sub-assemblies in a fixture, such that, the low melt solder 41, is in contact with the high melt solder layer 43, and then reflowing layer 41, without reflowing or softening layer 43. This completed assembly 25, can then be checked as required. After passing testing, such as, leak testing, an optional heat sink 36, may be attached to exposed back surface of the cap 20.

As stated earlier that the melting point of the solder wall or layer 43, is higher than the melting point of the solder interconnection layer 41. For manufacturing through-put it is preferred that the thick solder wall 43, has a melting point which is at least 50° C. higher than the melting point of the thin interconnecting solder layer 41. This difference in the solder melting points, assures a good seal between the substrate 10, and the cap or cover 20, during the melting of the thin solder interconnection layer 41, without any melting or erosion of the solder wall 43.

This new solder structure has several cost and reliability advantages. This is because the new thick solder structure 23 (comprising layers 43/41), has the ability to accommodate a greater range of expansion mismatches between the cap 20, and the substrate 10. One potential savings is that cap TCE selection can become less product specific, which can reduce the number of required designs, and be subject to price volume discounts.

Another potential savings is that since a greater range in expansions can be accommodated, cap TCE tolerances can be increased significantly, reducing cap costs. The greatest expected cost benefit is that less expensive cap materials, with less optimum TCE properties can now be used as materials for the cap 20.

Another benefit is that this solder structure 23 (comprising the metal layers 43/41), may be incorporated into existing designs for significant extensions in seal reliability.

Another performance advantage is that this invention can allow the module designer the option of using caps with higher thermal conductivities, for reduced chip operating temperatures, and therefore longer module life.

The advantages of an electronic package or module such as the one disclosed in this patent application are many. Such as, the cost of the package may be reduced by (a) opening up the TCE tolerance on caps, and/or (b) use of less expensive cap materials.

Furthermore, this invention provides a higher performance option for some packages, because ceramic caps may be replaced with caps of higher thermal conductivity, reducing chip operating temperatures.

The structure and process of this invention offer several advantages over prior art. For example, it allows use of caps which have higher thermal conductivity, i.e., WCu, AlSiC, composites of Cu & Invar, CuVar, SilVar, to name a few, and/or lower cost. As a direct replacement for existing solder seal packages, it provides a significant improvement in seal reliability.

Another advantage of the present invention is that the option for module reworkability is maintained, which keeps the cost of scrap losses down.

EXAMPLE

The following example is intended to further illustrate the invention and is not intended to limit the scope of the invention in any manner.

Example 1

With the current invention, the new solder seal results in a cap 20, to substrate 10, separation of about 0.3 mm to about 2.0 mm, and typically about 1.0 mm.

A solder interconnection structure of this invention was assembled, having a temperature hierarchy consistent with the preferred embodiment, as shown in FIGS. 4–7. The thick wall layer 43, had about 90 percent Pb and 10 percent Sn, which created a melting point of about 300° C. for wall layer 43. The bottom interconnection layer 41, had about 63 percent Sn and about 37 percent Pb which created a melting point of about 183° C. for the layer 41. The solder wall 43, was cast into a mold 60, and then reflowed and transferred onto area 21, of the cover 20. This was followed by the deposition of a thin layer of the solder interconnection layer 41, over the already cast solder wall 43, and onto area 11, of the substrate 10. At this point, substrate 10, and the cap 20, were cleaned. The substrate 10, and the cap 20, were then secured to each other by reflowing the thin solder interconnection layer 41, and forming module 25. It should be noted that during the reflowing of the thin solder interconnection layer 41, the cast solder wall 43, neither softened nor melted. The module 25, was then leak tested and it was found to be hermetic.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A seal band to provide a hermetic seal between a cover and a semiconductor substrate, said seal band comprising at least one high melting point thick solder wall secured to said cover and at least one first thin solder interconnection layer securing said substrate to said high melting point thick solder wall, wherein said first thin solder interconnection layer is made from a lower melting point solder material than said high melting point thick solder wall, wherein upon reflow said first thin solder interconnection layer does not reflow into said high melting point thick solder wall, such that said solder seal band retains its layered structure, and wherein the melting point temperature difference between said high melting point thick solder wall and said at least one first thin solder interconnection layer is at least 50° C.

2. The seal band of claim 1, wherein material for said cover is selected from a group consisting of alumina, aluminum, aluminum nitride, composites of aluminum and silicon carbide, copper, copper-tungsten, cuvar, silvar, and alloys thereof.

3. The seal band of claim 1, wherein material for said at least one thin solder interconnection layer is selected from a group consisting of lead/tin, lead/indium, tin/bismuth, indium/silver, tin/antimony, tin/silver, and alloys thereof.

4. The seal band of claim 1, wherein said first thin solder interconnection layer is of a lead/tin material, and wherein said lead is in the range of about 0 to about 40 percent by weight.

5. The seal band of claim 1, wherein said first thin solder interconnection layer is of a lead/indium material, and wherein said lead is in the range of about 30 to about 60 percent by weight.

6. The seal band of claim 1, wherein said first thin solder interconnection layer is of a tin/bismuth material, and wherein said tin is in the range of about 37 to about 48 percent by weight.

7. The seal band of claim 1, wherein said first thin solder interconnection layer has up to about 2 percent content by weight of copper or alloy thereof.

8. The seal band of claim 1, wherein material for said high melting point thick solder wall is selected from a group consisting of lead/tin, lead/indium, tin/bismuth, indium/silver, tin/antimony, tin/silver, and alloys thereof.

9. The seal band of claim 1, wherein said high melting point thick solder wall is of a lead/tin material, and wherein said lead is in the range of about 60 to about 100 percent by weight.

10. The seal band of claim 1, wherein said high melting point thick solder wall is of a lead/indium material, and wherein said lead is in the range of about 70 to about 100 percent by weight.

11. The seal band of claim 1, wherein said high melting point thick solder wall is of a tin/bismuth material, and wherein said tin is in the range of about 77 to about 100 percent by weight.

12. The seal band of claim 1, wherein said high melting point thick solder wall is of a tin/bismuth material, and wherein said tin is in the range of about 0 to about 20 percent by weight.

13. The seal band of claim 1, wherein said high melting point thick solder wall is an alloy having up to about 2 percent content by weight of copper or alloy thereof.

14. The seal band of claim 1, wherein at least one heat receiving device is secured to said cover.

15. The seal band of claim 1, wherein material for said substrate is selected from a group consisting of alumina, alumina with glass frits, aluminum nitride, borosilicate, ceramic and glass ceramic.

16. The seal band of claim 1, wherein at least one electrical connection is secured to said substrate, and wherein said electrical connection is selected from a group consisting of solder ball, solder column, low-melting point solder, high-melting point solder, pin or wire.

17. The seal band of claim 1, wherein at least one electrical element is secured to said substrate, and wherein said electrical element is selected from a group consisting of semiconductor chip or decoupling capacitor.

* * * * *